US007612382B2

(12) United States Patent
Kash et al.

(10) Patent No.: US 7,612,382 B2
(45) Date of Patent: Nov. 3, 2009

(54) METHOD FOR DEFEATING REVERSE ENGINEERING OF INTEGRATED CIRCUITS BY OPTICAL MEANS

(75) Inventors: Jeffrey A. Kash, Pleasantville, NY (US); James C. Tsang, White Plains, NY (US); Daniel R. Knebel, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/140,714

(22) Filed: Jun. 17, 2008

(65) Prior Publication Data

US 2008/0252331 A1    Oct. 16, 2008

Related U.S. Application Data

(62) Division of application No. 11/541,997, filed on Oct. 2, 2006, now Pat. No. 7,399,992, which is a division of application No. 10/324,963, filed on Dec. 20, 2002, now Pat. No. 7,115,912, which is a division of application No. 09/603,570, filed on Jun. 23, 2000, now Pat. No. 6,515,304.

(51) Int. Cl.
   *H01L 27/15* (2006.01)
(52) U.S. Cl. .................... 257/84; 257/389; 382/312
(58) Field of Classification Search .............. None
   See application file for complete search history.

(56) References Cited

U.S. PATENT DOCUMENTS 4,105,216 A    8/1978    Graham et al.
4,933,898 A    6/1990    Gilberg et al.
5,165,098 A *  11/1992   Hoivik ............... 380/254
5,297,201 A *  3/1994    Dunlavy .............. 380/252
5,384,457 A    1/1995    Sommer
5,894,517 A *  4/1999    Hutchison et al. ........ 713/189
5,903,510 A    5/1999    Kodama
5,940,545 A    8/1999    Kash et al.
6,028,952 A    2/2000    Kash et al.
6,137,318 A    10/2000   Takaaki
6,294,816 B1   9/2001    Baukus et al.
7,020,730 B2 * 3/2006    Kniffler ............. 710/305

OTHER PUBLICATIONS

Kash et al., "Dynamic Internal Testing of CMOS Circuits Using Hot Luminescence", IEEE Electron Device Letters, vol. 8, No. 7, Jul. 1997, pp. 330-332.

* cited by examiner

*Primary Examiner*—Leonardo Andújar
(74) *Attorney, Agent, or Firm*—Jose Gutman; Fleit, Gibbons, Gutman, Bongini & Bianco P.L.

(57) ABSTRACT

A method for an electronic device is provided for preventing reverse engineering by monitoring light emissions emitted from transistors and such electrically active devices in the electronic device. The method emits extraneous randomized light emissions in substantial close proximity to the transistors to hide a pattern of light emissions emitted from the transistors. As one feature, the device can include a source of randomized light emissions in substantial close proximity to the transistors to hide a pattern of the emitted light from the transistors in randomized light emissions emitted by the source. As a second feature, the device can emit the randomized light emissions by randomly delaying an electrical signal that is electrically coupled to the transistors and, in response to the randomly delayed electrical signal, the transistors randomly emitting light emissions thereby hiding a separate pattern of light emission emitted from the transistors.

12 Claims, 12 Drawing Sheets

METHOD FOR DEFEATING REVERSE ENGINEERING OF INTEGRATED CIRCUITS BY OPTICAL MEANS

CROSS REFERENCE TO RELATED APPLICATION

This is a divisional of application Ser. No. 11/541,997 filed Oct. 2, 2006, now U.S. Pat. No. 7,399,992, which was a divisional of Ser. No. 10/324,963 filed Dec. 20, 2002, now U.S. Pat. No. 7,115,912, which was a divisional of Ser. No. 09/603,570 filed Jun. 23, 2000, now U.S. Pat. No. 6,515,304; the entire collective teachings thereof being herein incorporated by reference.

BACKGROUND OF THE INVENTION

1. Field of the Invention

This invention generally relates to reverse engineering of integrated circuits by optical monitoring and analysis, and more particularly to devices for defeating such reverse engineering of integrated circuits.

2. Description of the Prior Art

The term "reverse engineering" has the general meaning of understanding how any item operates or was constructed, based mainly on knowing the general function of the item and any information that can be learned by direct examination of the item itself. Reverse engineering is considered "non-destructive" if the item is still functional at the end of the reverse engineering process.

With regards to an integrated circuit (IC) made up from transistors, diodes, and passive devices, reverse engineering can be applied to either (i) determine the processes and materials that went into the IC manufacturing process, or (ii.a) determine the physical locations of the subcircuits or circuit elements comprising the IC, (ii.b) determine the logical functions and other functional characteristics of the subcircuits or circuit elements comprising the IC, (ii.c) determine the device-level schematic of the transistors comprising each subcircuit or circuit element, (ii.d) determine the performance of the subcircuits or circuit elements comprising the IC and (ii.e) determine stored information necessary for the operation of some circuit. In this disclosure, we are concerned with defeating certain of these second types of reverse engineering.

Conventional methods of reverse engineering are usually physical methods that are often destructive of an IC. Often these methods require unpackaging, and sometimes at least partially dissecting the IC, making it very difficult to use the IC afterwards. Further, these prior art methods typically involve significant manual intervention by technical personnel. Therefore, the methods can be tedious and inefficient. In addition, some kinds of information about circuits, such as the contents of non-volatile semiconductor memories often cannot be obtained by disassembly of the chip.

The least destructive, or non-destructive, methods for reverse engineering, such as looking at power consumption or looking at RF emissions from an IC, normally have limited or no spatial resolution. Therefore, they usually cannot provide information at the gate level about either the physical location of subcircuits of the chip or the device-level schematic of the transistors comprising each subcircuit. They cannot generate this kind of information in reverse engineering a circuit. They therefore make little use of information about the spatial layout of a chip that can be readily obtained by optical inspection. Reverse engineering a complex IC without spatial information about specific devices that are in close proximity to each other on the IC can be very difficult with these methods. Additionally, such conventional techniques are readily defeated by a number of simple countermeasures that are well known.

In view of the above mentioned problems with prior art methods of reverse engineering, the present inventors have taught methods for reverse engineering by monitoring induced light emissions from the active elements in integrated circuit (IC) chips in a co-pending patent application Ser. No. 09/468,999, entitled "Method And Apparatus For Reverse Engineering Integrated Circuits By Monitoring Optical Emission", filed on Dec. 21, 1999, by inventors Kash et al., and the teachings of which are incorporated herein by reference. Generally, light emissions from active elements can be monitored using methods and apparatus that have been taught in the following identified co-pending patent applications, the first one being numbered Ser. No. 08/683,837, entitled "Non-invasive optical method for measuring internal switching and other dynamic parameters of CMOS circuits", filed on Jul. 18, 1996, by inventors Kash et al., and the second one being numbered Ser. No. 09/026,063, entitled "System and method for compressing analyzing time-resolved optical data obtained from operating integrated circuits", filed on Feb. 19, 1998, by inventors Kash et al., and which are both owned by the assignee of the present invention, and the teachings of which are incorporated herein by reference.

The methods of reverse engineering integrated circuits by monitoring induced light emissions from the active elements in IC's, such as taught by the present inventors in co-pending patent application Ser. No. 09/468,999, are a very powerful tool for extracting information from an integrated circuit as well as for determining the circuit topology. A manufacturer of an integrated circuit, in certain applications, may wish to protect an integrated circuit from such reverse engineering analysis. For example, a SmartCard or other secure electronic device that contains at least one IC with confidential information may need its electronic memory protected from unauthorized reverse engineering.

The above optical methods of non-destructively obtaining information about the design, operation, programmable parameters, and performance of an integrated circuit represent one possible approach to reverse engineering an integrated circuit by combining the physical appearance of the circuit elements, and using the effect of the operation of the circuit on light. Other approaches producing similar information include the measurement of the modulation of a light beam by voltages in an IC.

Accordingly, the inventors of the present invention recognize a need for a manufacturer of an integrated circuit to efficiently limit the information provided by the generation and/or the detection of induced light emissions and/or the modulation of the optical response from the active elements in IC's to defeat such reverse engineering as discussed above.

DESCRIPTION OF THE PREFERRED EMBODIMENTS

An invention discussed in co-pending patent application Ser. No. 09/468,999, entitled "Method And Apparatus For Reverse Engineering Integrated Circuits By Monitoring Optical Emission", filed on Dec. 21, 1999, by inventors Kash et al. facilitates non-destructive reverse engineering by monitoring induced light emissions from active elements or active devices in an integrated circuit, the teachings of which are incorporated herein by reference.

A publication by H. Heinrich (IBM J. Research and Development 34, 162 (1970)) discloses facilitating non-destructive reverse engineering by monitoring the modulation of a reflected light beam by parts of active elements or active devices in an IC, the knowledge of which is incorporated herein by reference. Specifically, reflection of light occurs at interfaces between materials with different properties. Examples of such interfaces include metals placed on semiconductor to form Schottky barrier devices, and the region between an n and a p doped semiconductor. The magnitude of the reflectivity depends on the difference of the optical frequency dielectric constants on the two sides of the interface. The presence of a voltage drop across an interface such as occurs between a metal and a semiconductor, or between an n and a p doped region of a semiconductor can also modify the reflectivity of the interface. A time varying voltage across such an interface produces a time varying modulation of the reflectivity from the interface that can be measured and used to obtain information about the time varying voltage. The source and drains of field effect transistors consist of p-n junctions. As the output of the transistor is switched, the p-n junctions go from unbiased to reversed biased. The reflection of a laser beam incident on this interface can sense changes in the voltage across the interface. The light emitted from the active device, as a result of the reflection of the laser beam on the interface, can be monitored external to an integrated circuit chip to sense electrical changes in the interface. These light emissions may allow external monitoring to reverse engineer the circuit.

Figure 1:
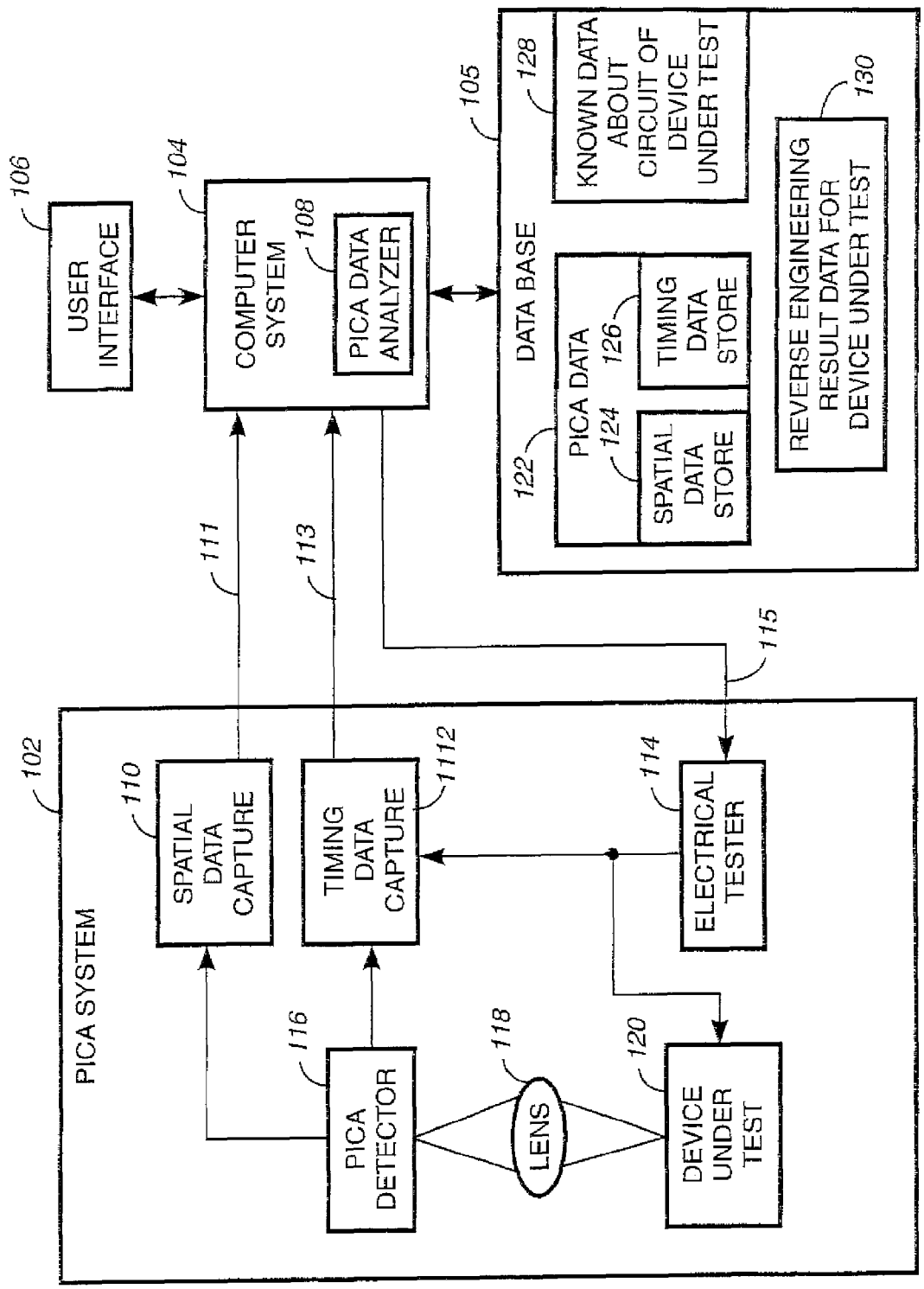
FIG. 1 is a block diagram of a reverse engineering system by monitoring induced light emissions from the active elements in integrated circuits.
Figure 2:
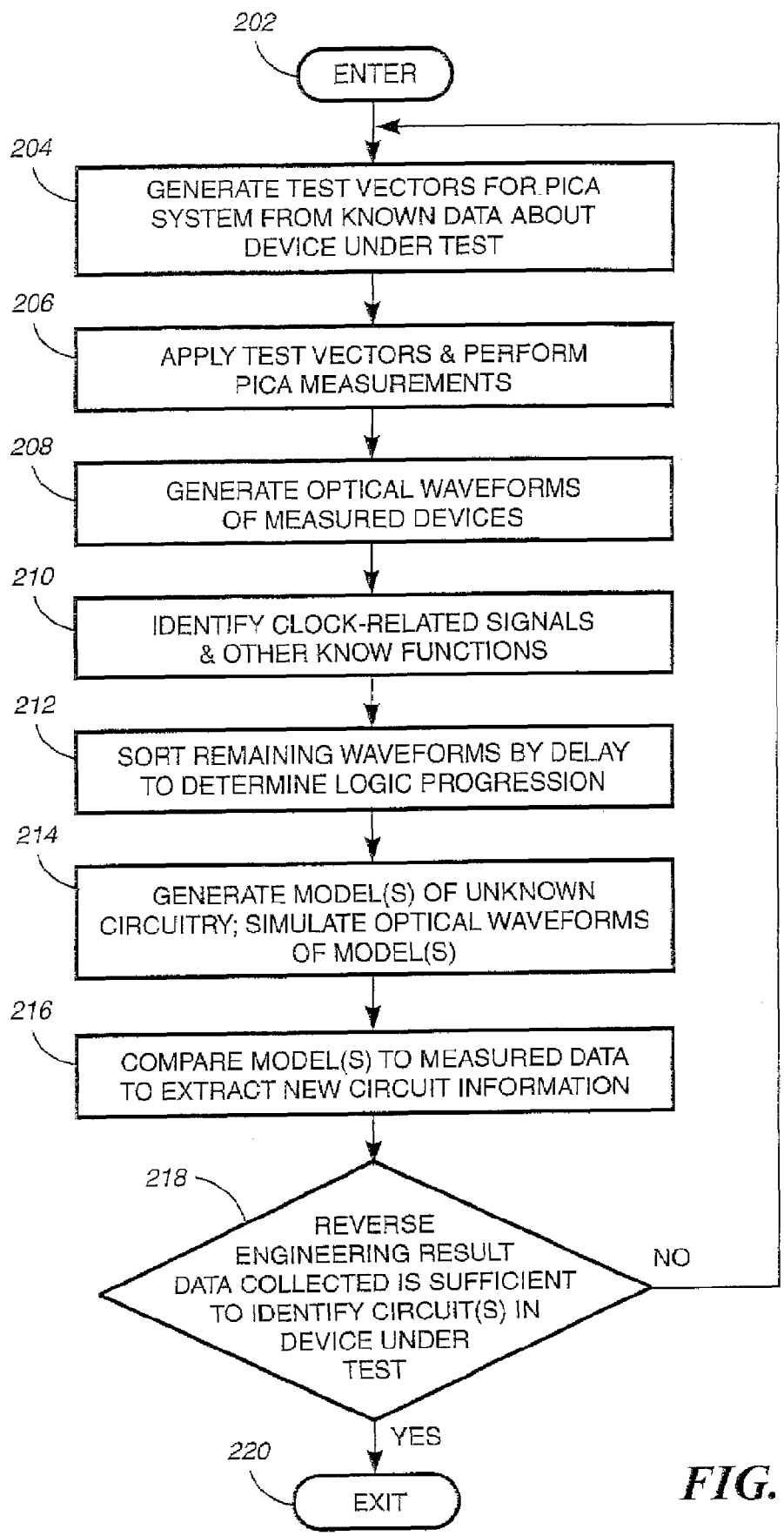
FIG. 2 is an operational flow diagram illustrating operations of the system of FIG. 1.
Figure 3:
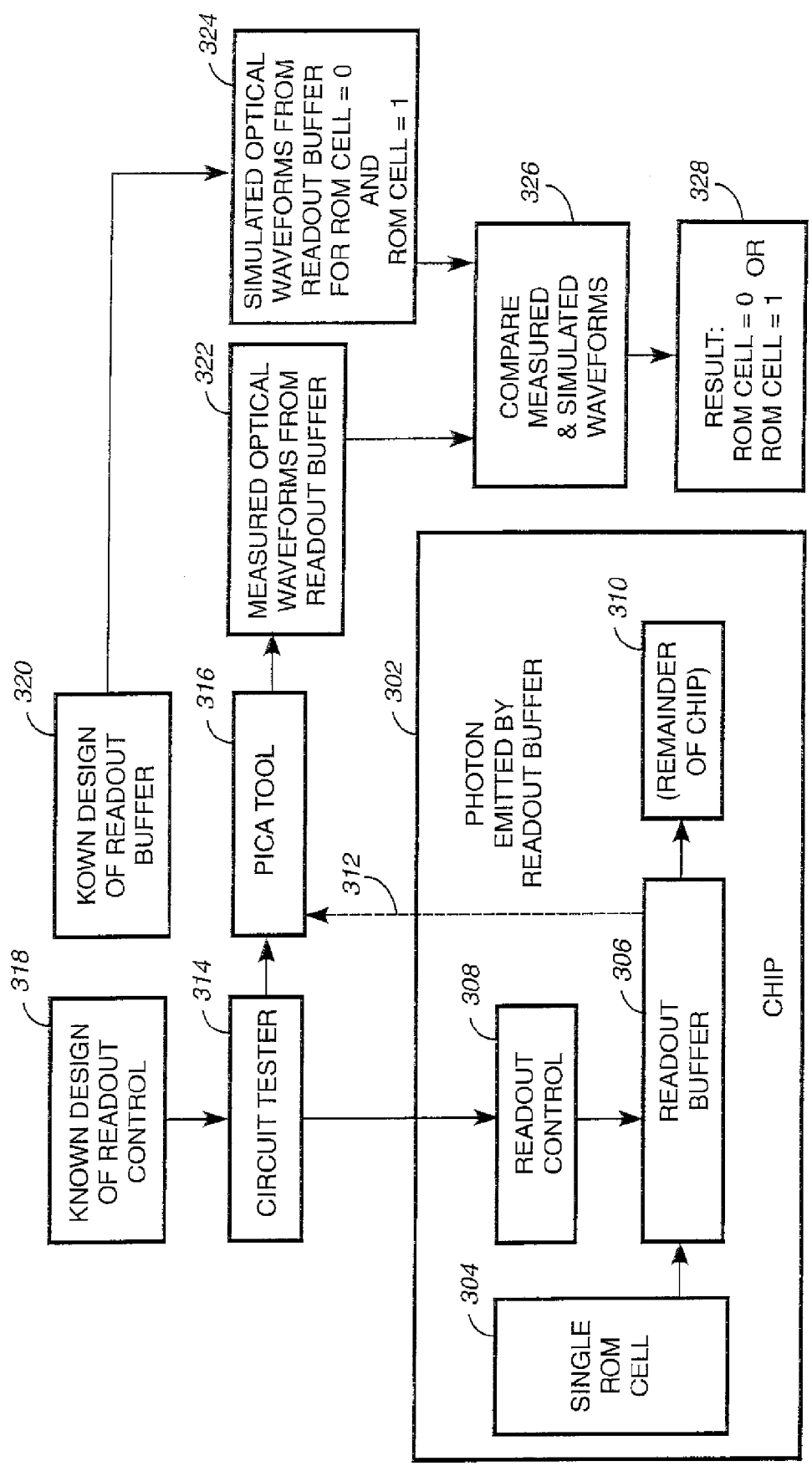
FIG. 3 is a data flow diagram showing an exemplary reverse engineering system operating on a memory in an integrated circuit by monitoring induced light emissions from the active elements in the memory in the integrated circuit chip.

Referring to FIGS. 1, 2, and 3, for effective reverse engineering of a circuit supporting substrate, such as an integrated circuit (IC), a multilayer circuit board, and a high density circuit module, (hereinafter broadly referred to as an "integrated circuit" or as an "IC"), a test system would repeatedly run tests on an integrated circuit, such as by using an electrical circuit test generator. The test system exercises the integrated circuit and makes it operate thereby inducing light emissions from active elements or devices in the circuit under test. As illustrated in FIGS. 1, 2, and 3, an exemplary embodiment of a PICA system 102 can monitor and collect light emissions from an integrated circuit under test as discussed below.

The PICA system 102 is an imaging system that simultaneously collects space and time information from every part of an IC so a monitoring system does not have to move from one device to another device in a circuit while collecting data. The PICA system 102 simultaneously collects data from all of the devices (circuit elements) in a circuit in an IC. Normally, optical emissions induced from one or more devices in an IC are monitored across a planar view of the IC via a lens 118 and a PICA detector 116.

Typically, spatial information is collected, by spatial data capture means 110, by using an X-Y grid to define a planar position in a viewing plane for light emissions. Time information is collected, by timing data capture means 112, by comparing occurrences of light emissions from devices in the circuit of the IC with a standard time base and a start reference signal that is normally injected into the IC to induce the light emissions. Using the PICA system 102 to monitor time and space information of patterns of light emissions from devices in circuits in an IC under test can yield reliable and efficient mapping of such devices and circuit.

Analysis of the data collected from the PICA system in conjunction with information already known and stored in memory 128 about the integrated circuit normally results in new information that is then additionally known and stored in memory 128 about the integrated circuit under test. This new information is additionally stored in the known information memory 128 to allow iterative reverse engineering of a circuit under test utilizing progressively more known information about the circuit under test. This progressive uncovering of information provides a process for reverse engineering circuits within an integrated circuit.

The reverse engineering system, for example, captures time based patterns of optical pulses emitted upon injection of a signal into the IC, then followed by the optical emissions emitted, say, 50 or 100 picoseconds later, and then followed by a next set of patterns of optical emissions occurring at some time interval thereafter. By sampling at periodic time intervals, the reverse engineering system would time order the patterns of optical emissions being collected by the PICA system 102. This provides a set of patterns that can be compared against known reference patterns for known devices, etc., to assist in reconstructing a circuit model of devices in a circuit in an IC.

The reverse engineering system typically compares a collected and measured pattern to a reference pattern to determine what a PICA emission pattern from a device, such as an inverter latch in an IC, ought to look like. The reverse engineering system could then correlate which of the emission spots were caused by each candidate latch under test.

The reverse engineering system correlates the pattern of emissions that were sampled and measured from a circuit supporting substrate, such as an IC, to a candidate reference model (profile) of what emission patterns for an inverter latch should look like. The reverse engineering system matches the sampled patterns of optical emissions to certain profiles of emissions that represent standard profiles, such as for an inverter latch, that are stored in a database in a computing system in the reverse engineering system.

If enough points in the sampled pattern match points in the stored reference pattern then the likelihood is that the measured sample matches the stored reference pattern, such as representing an inverter latch. On the other hand, if not enough points match between the sampled pattern and the current reference pattern, then the reverse engineering system would go to attempt to match a next likely device reference profile pattern stored in the database.

The reverse engineering system preferably includes a database of standard reference profiles for a number of circuit elements that are expected in a certain IC or that would be likely in a certain IC. The reverse engineering system utilizes the stored profiles of devices that are expected to be in a circuit in the IC under test to attempt to create a model of the circuit. By using the PICA system to look at the layout of the circuit as indicated by optical emissions, for example, a series of latches may become visible to the PICA system optically recognized in some kind of a line, e.g., a circuit segment, of similar structures repeating several times, e.g., such as representing several latches in a circuit. The layout of optical emissions indicates the series of latches. Using the PICA system the reverse engineering system collects the optical emissions from the circuit under test.

The PICA system 102, as discussed above, operates as an imaging system to simultaneously capture space and time information from every part of the IC. Optical emissions from the IC are monitored over a spatial grid over the IC (space information) and across a number of defined time intervals (time information).

The PICA system 102 can capture a snapshot in time with a pattern of optical emissions. This could be analogized to taking a still picture of a pattern of optical emissions at a point in time. A sequence of such snapshots can also be captured. This may be analogized to taking a movie of the optical emissions. Additionally, the PICA system can capture a time response for any plurality of pixels thereby capturing patterns over time. A time response from any such plurality of pixels is referred to as an optical waveform.

For example, a reverse engineering system can determine the location of an FET device, such as by the X-Y coordinates of optical emissions from the FET when monitoring a circuit in an IC. Additionally, a time response of the light emissions from that FET can be monitored, such as by monitoring optical waveforms for each pixel in the pattern of light emissions from the FET. For example, these waveforms can indicate a series of states, e.g., ON-OFF, of an FET transistor switch.

The time response is measured against a triggering time base signal provided by electrical circuit tester 114 to the IC under test. This external trigger signal is also provided from the circuit tester to the timing data capture means to synchronize the PICA system monitoring time base with the injection signal being provided to the IC to exercise the circuit elements under test. The triggering signal indicates to the PICA system when the injection signal starts exercising the circuit in the IC. This provides a time reference for measuring time intervals to capture the optical waveforms synchronized to a known time base.

The reverse engineering system typically repeats the circuit test many times, i.e., repeats the at least one test vector many times by repeatedly injecting the test signal into the IC. This repeated circuit exercising allows repeated monitoring of the light emissions of the devices in the circuit under test in response to a known injection signal. The PICA system in this way can repeatedly capture the optical emissions and the reverse engineering system thereby creates a measured profile of each of the devices in the circuit under test. After repeating the at least one test vector for many times, the PICA system has captured a profile of the optical emissions from each one of the transistors.

The reverse engineering system can determine a clock signal distribution network across an IC to determine, for example, major logic blocks within an IC that are usually all linked to a common clock signal. Most IC's have publicly available test vectors for powering and exercising the clock circuit for the IC. This is a commonly available test vector to circuit designers. Once the clock power circuit is exercised by the circuit tester, the PICA system can monitor light emissions from across the IC to identify the location of timing circuit elements across the IC.

As illustrated in FIG. 3, the reverse engineering system can be used to reverse engineer the contents of a memory device. A memory read out circuit, for example, can be repeatedly exercised to read out the value of a memory cell. A test vector can be repeatedly executed by a circuit tester 314 to continuously and repeatedly read out the value of a memory cell in an IC.

The read out control circuit, in response to repeatedly reading out the value of a memory cell, repeatedly emits a pattern of light emissions that can be collected by the PICA system 316 to capture a profile of the read output of the memory cell. For example, the PICA system can determine the read output of a ROM cell. This creates a profile of the contents, or value, of the ROM cell by monitoring the light emissions therefrom during repeated read cycling of the output circuits of the ROM cell. The light emissions are collected with the PICA system 316 that is time synchronized to the circuit tester. The PICA system 316 in this way measures and profiles the wave forms from the ROM read out buffer.

If the design of the memory cell read out buffer is known and preferably can be exercised, then one can simulate what optical wave form would be expected for a ROM cell value equal to zero and similarly what optical wave form would be expected for a ROM cell value equal to one. Typically, a one to zero transition at the output of a readout buffer will produce a much larger pulse of optical emissions than a zero to one transition. By monitoring these transitions relative to a known time base the reverse engineering system can determine the value stored in the ROM. The reverse engineering system 102 would compute both simulations for zero-to-one and for one-to-zero transitions and would have them stored in a database as known profiles or templates. Then, the reverse engineering system would compare them to the "unknown" measured profile to determine which simulation matched a best fit to the pattern in the measured profile. The result 328 then would indicate whether a ROM cell was at the value of zero or at a value of one. FIG. 3, therefore, comprises an exemplary method for determining a value that has been permanently stored in a ROM circuit.

Additionally, it is often useful to determine the performance of subcircuits as part of reverse engineering, so as to determine the ultimate capabilities of the circuit, such as speed, tolerance under certain environmental conditions such as high temperature, and radio frequency interference immunity. Performance of circuits under varying environmental conditions can also be monitored by the PICA system 102 for analysis in a reverse engineering application.

Similarly, if a light beam is incident on an interface of an IC across which a voltage is developed, changes in the voltage will produce a modulation of the reflectivity of the interface. This produces detectable changes in the reflected light from the interface at which the time varying voltage is developed. This creates a detectable optical waveform of the time varying voltage. By measuring the optical waveforms of the inputs and outputs of a circuit element, this can be used to create a profile of the function of the gates in the circuit.

Figure 4:
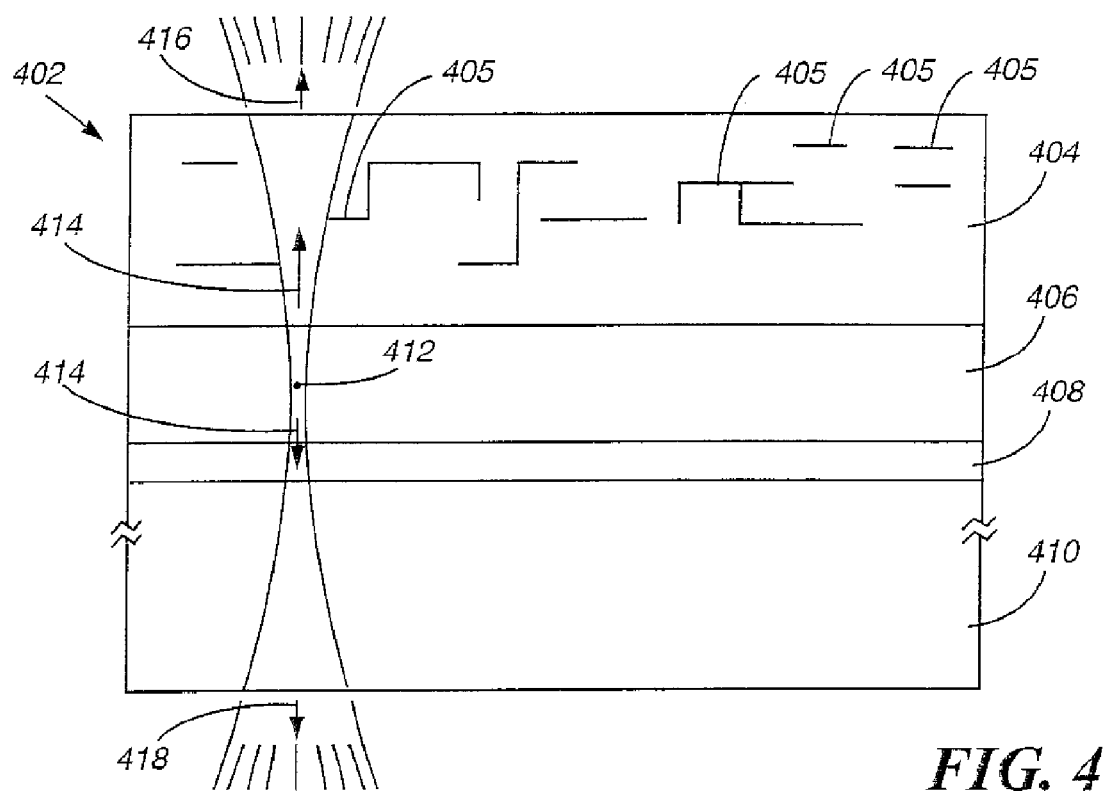
FIG. 4 is a side planar X-ray view of an exemplary integrated circuit illustrating induced light emissions from an active element in the integrated circuit.
Figure 5:
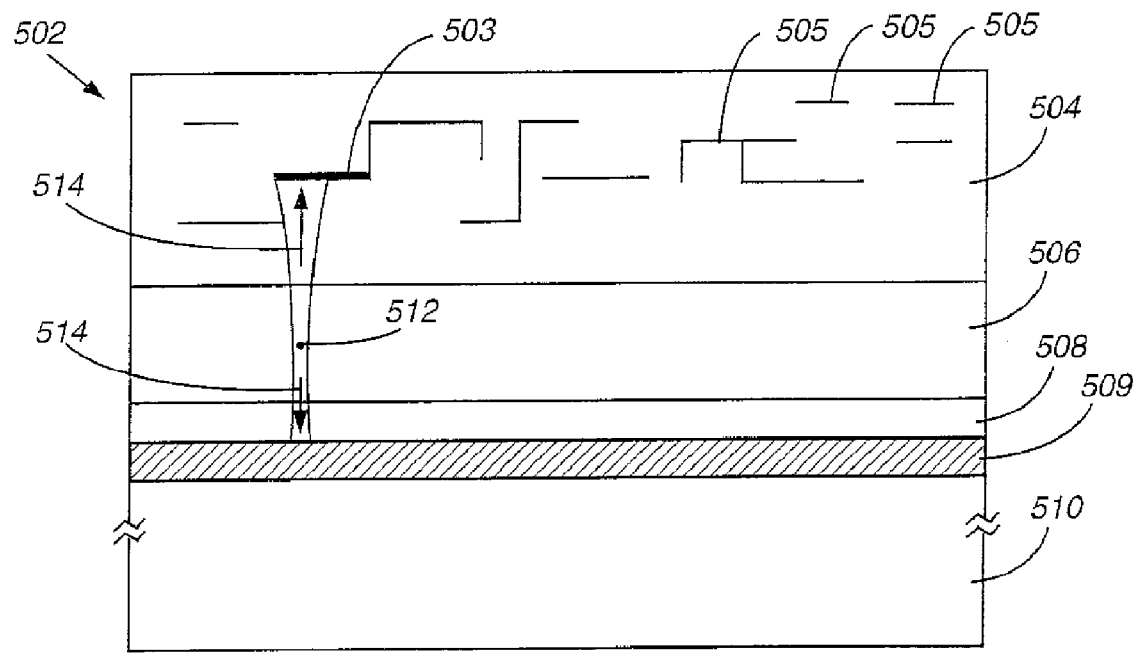
FIG. 5 is a side planar X-ray view of the exemplary integrated circuit of FIG. 4 that has been structurally modified to defeat external monitoring of the induced light emissions from the active element in the integrated circuit, in accordance with a preferred embodiment of the present invention.

FIGS. 4 and 5 illustrate a preferred device for preventing detection of a predetermined pattern of optical signals 416 and 418 external to a circuit supporting substrate 402 and 502, the optical signals 416 and 418 being from an active element or device, such as a field effect transistor (FET) 412 in an exemplary IC 402 or due to reflected light from an external probe at an interface associated with the FET such as an output node diffusion. The IC 502, as shown in FIG. 5, has been modified from the IC 402 shown in FIG. 4 to include the device for preventing external detection and monitoring of the light 416 and 418.

The IC 402 typically includes various layers. At least one metallization layer 404 supports various metal circuit structures, such as runners and connections 405, to interconnect circuit elements in the IC 402. At least one circuit supporting layer 406 supports circuit elements, such as the FET 412. An insulation layer 408 may be included in the IC 402. A silicon substrate layer 410 typically provides a foundation layer in the IC 402. The FET 412 and its parts can interact with photons during operation. This can take the form of optical emissions 414 that can be monitored as front side emissions 416 (front side of the IC 402) and as back side emissions 418 (back side of the IC 402). Changing voltages in different parts of the FET can induce reflectivity changes at these parts.

As shown in FIG. 5, the IC 502 includes a metallization layer 504, a circuit supporting layer 506, an insulation layer 508, and silicon substrate layer 510. An additional opaque layer 509 is preferably included in the IC 502, as shown, to block the optical signal 514 from emerging out of the backside of the IC 502. Preferably this opaque layer comprises metal or other material that is optically opaque to the light 514. The metallization layer 504 includes metal runners and connectors 505. Certain metal runners 503 can be strategically located and/or enlarged to provide an opaque layer to block light 514 which interacts with the FET 512. This prevents front side detection of light 416 and precludes external monitoring of optical signals to reverse engineer the circuit element 512 inside the IC 502.

An opaque or absorbing layer, herein interchangeably referred to as opaque, blocks optical signals 416 and 418 from external monitoring according to a preferred embodiment of the present invention. An opaque layer or structure may be placed at least partially covering a circuit of interest. Preferably, removal of the opaque layer or structure results in impaired function of the electrical circuit of interest. For example, partial removal of a ground plane (opaque layer) may destroy noise immunity between circuits in the IC and therefore impair functions of the circuit of interest. Because optical signals 416, 418, can be monitored from either the front side or the back side of an IC 502, an opaque layer is preferably placed both above and below the circuit, as illustrated in FIG. 5. To prevent the detection of light from the front side of the IC 502, layers of metal can be provided as part of the IC 502 wiring and metallization 503. To prevent detection of light from the back side of the IC 502, a deep, heavily implanted layer 509 can be placed under the circuit of interest, e.g., the FET 512. If the conductivity of this layer 509 after annealing is high enough, it will be opaque to optical emissions 512. This method of implanting a layer may be particularly practical with silicon-on-insulator technology, where the opaque layer 509 could be placed between the substrate 510 and the insulating layer 508. If placed at this location, the opaque layer 509 would have no significant effect on the operation of the IC 502, yet removal would result in a physically fragile IC 502 that would likely contain cracks or other defects rendering the IC 502 inoperable.

Figure 6:
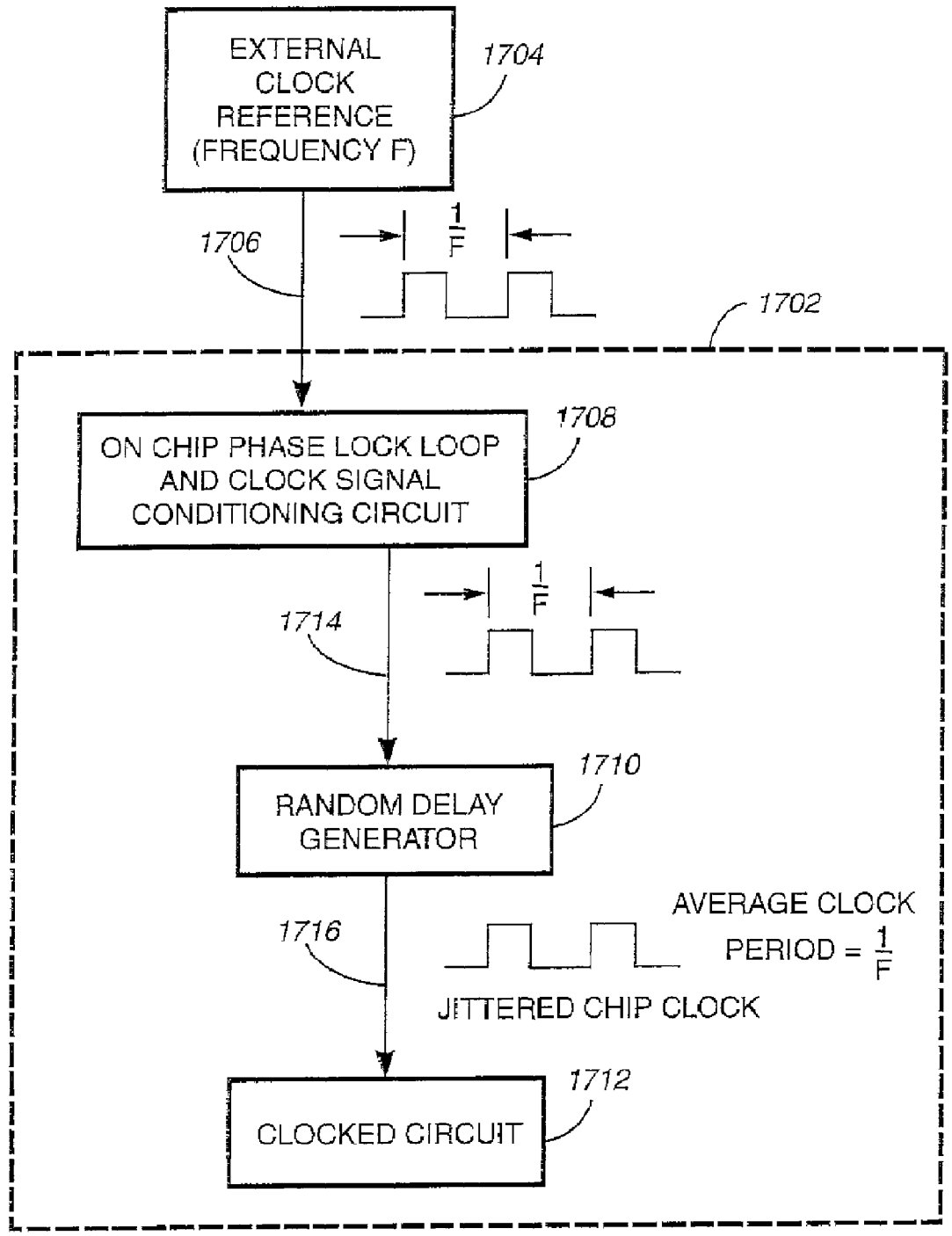
FIG. 6 is an electrical block diagram showing a clocked circuit in an integrated circuit in accordance with a preferred embodiment of the present invention.

Another alternative embodiment of the present invention is shown in FIG. 6. In this example, an external clock signal 1706 is randomized 1716 inside an IC 1702 by a random delay generator 1710. By randomizing an internal clock signal 1716 to a clocked circuit 1712 the external light emissions or the modulated reflection of light from active devices in the clocked circuit 1712 do not create a steady state pattern that can be detected and monitored by a PICA system 102 or a laser voltage probe system to detect a predetermined pattern. This prevents detection of a predetermined light pattern for reverse engineering the internal clocked circuit 1712 by the PICA system 102.

The weakness of the interaction of light with electrical signals in a silicon IC, when coupled with the high speeds of current integrated circuits, means that complete optical waveforms of electrical activity cannot be obtained in a single pass of a set of instructions through an integrated circuit. Complete optical waveforms of electrical activity in an IC require the repetitive operation of the circuit since the waveforms are obtained through sampling and/or the summation of low probability events to obtain adequate signal to noise. In FIG. 6, a PICA system 102, or a laser voltage probe such as that devised by Heinrich, typically monitors a clock signal 1706 being coupled to the IC 1702 by an external clock source 1704. Typically, a phase lock loop and on board clock signal conditioning circuit 1708 translates the external clock signal 1706 to a clock signal internal to the IC 1702. According to a preferred embodiment of the present invention, a random delay generator 1710 inside the IC 1702 adds randomizing jitter to the clock signal and provides a jittered clock signal 1716 to a clocked circuit 1712 in the IC 1702.

By monitoring the external clock signal 1706 while measuring light arising from interactions with this active devices in the IC 1702, a measurement system 102 captures time dependent patterns of light intensities from the active devices in the clocked circuit 1712 relative to transitions of the external clock signal 1706. This pattern capture process is repeated by the measurement system 102 until a repeatable pattern is detected and matched to a known reference circuit thereby facilitating reverse engineering of the clocked circuit 1712. However, by randomizing the clock signal 1716 to a jitter ranging within an average clock signal period equivalent to the period of the external clock signal 1706 the external monitoring PICA system 102 does not capture repeatable light emission patterns. Under these circumstances, the measurement system 102 is not capable of deducing any known time varying light intensity patterns to identify circuit elements. The randomizing of clock signal consequently defeats reverse engineering of the clocked circuit 1712 by monitoring optical waveforms of active devices in the clocked circuit 1712.

Figure 7:
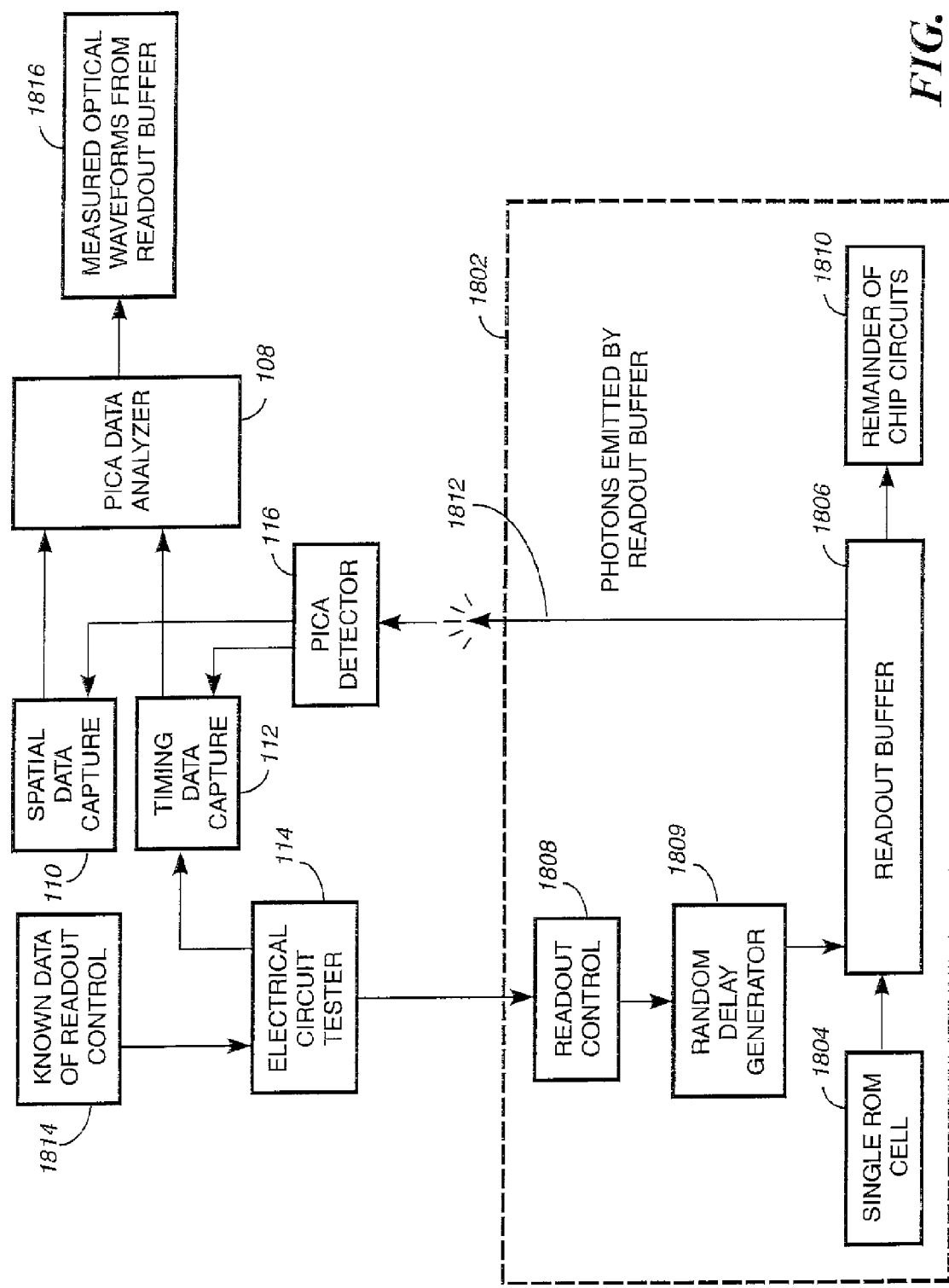
FIG. 7 is an electrical block diagram illustrating an exemplary reverse engineering system operating on a memory in an integrated circuit by monitoring induced light emissions from the active elements in the memory in the integrated circuit.
Figure 8:
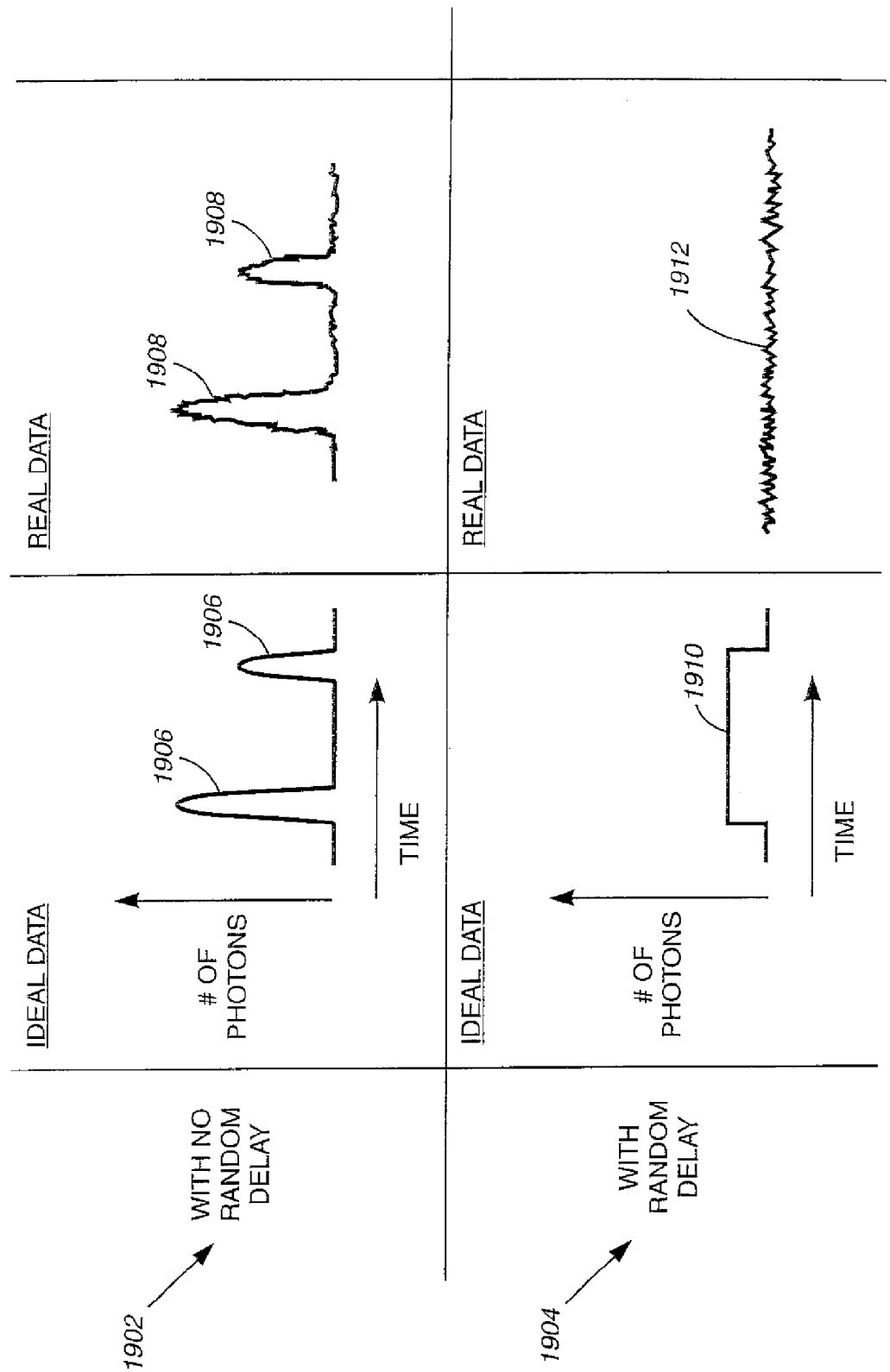
FIG. 8 is a set of time vs. detected photon emission charts illustrating optical waveforms from a readout buffer in the memory in the integrated circuit of FIG. 7.

FIGS. 7 and 8 illustrate an exemplary use of randomized clock signals inside an IC 1802 to defeat an attempt to reverse engineer the contents of a memory device, such as a read only memory (ROM) 1804, in the IC 1802. In this way, the external measurement system 102 can not deduce the data content of the ROM 1804 by detecting and monitoring external light intensities 1812 to determine a pattern. This protection of data is extremely valuable in many applications, such as to prevent unauthorized access to information in an electronic Smart-Card or other electronic secure access device.

FIG. 7 shows an exemplary IC 1802 comprising a ROM 1804 coupled to a readout buffer 1806. The readout buffer 1806 is typically controlled by a readout control circuit 1808 in response to a clock signal. By including a random delay generator 1809 between the output of the readout control circuit 1808 and the input of the readout buffer 1806, the optical waveforms describing 1812 will be randomly emitted from the IC 1802 thereby preventing the data analyzer 108 from detecting an optical waveform that can be matched to a known data pattern waveform. See also FIG. 1.

As shown in FIG. 8, without random delay 1902 a waveform pattern 1908 can be detected by a data analyzer 1802. Notice that an ideal waveform pattern 1906 is also shown for reference. On the other hand, by utilizing a random delay 1904 from the random delay generator 1809 the optical waveform 1912 become unpredictable and no real pattern can be deduced by the data analyzer 1802. Note again that an ideal randomized waveform 1910 is shown for reference. However, the randomized real data 1912 will be lost in noise signals and no pattern matching will be possible thereby defeating reverse engineering by monitoring optical waveforms from the readout buffer 1806.

In the case of a laser voltage probe system such as that presented by Heinrich, a short pulse laser is used to provide light to sample the reflectivity of a particular electrically biased interface in the circuit. The waveform is obtained by shifting the laser pulse with respect to the internal clock of the circuit. If the clock has a random jitter, then there is no time base for the sampling measurement.

In addition to the above teachings which can be used to defeat both PICA based, as well as laser probe based methods of reverse engineering circuits, means for defeating these methods individually are also taught here as follows.

Figure 9:
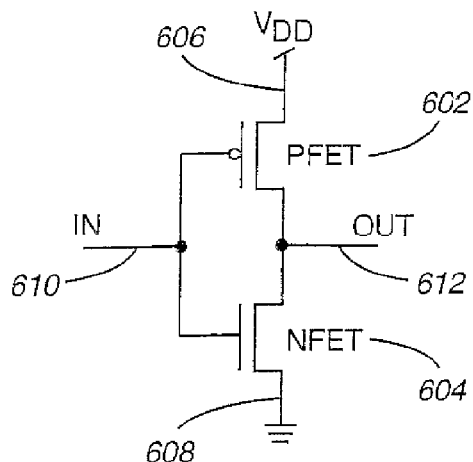
FIG. 9 is an electrical schematic diagram illustrating an exemplary inverter logic circuit.

FIG. 9 illustrates an inverter logic circuit comprising a PFET 602 and an NFET 604 arranged across power (VDD) 606 and ground 608 as shown. A logic ("1" or "0") signal at the input 610 is inverted and an inverted logic signal ("0" or "1", respectively) is provided by the inverter at the output 612.

Figure 10:
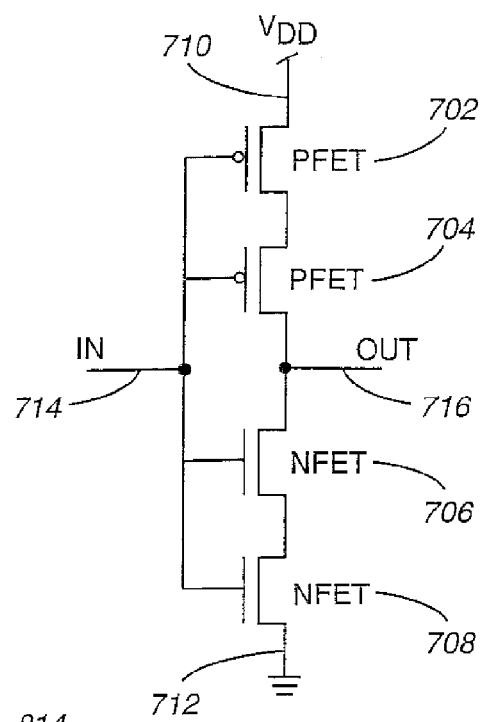
FIG. 10 is an electrical schematic diagram illustrating a first alternative inverter logic circuit example according to a preferred embodiment of the present invention.

FIG. 10 illustrates a modification to the inverter logic circuit of FIG. 9 to prevent optical monitoring of the IC according to a preferred embodiment of the present invention. This preferred embodiment significantly reduces the intensity of light emissions from active devices, such as FETs 702, 704, 706, and 708. Devices 702 and 708 are prevented from operating in the saturation state, thereby practically eliminating light emission. Devices 704 and 702 and devices 706 and 708 then share their respective output to supply voltage distributions, significantly reducing the intensity of light emission in devices 704 and 706. By significantly reducing the intensity of light emissions from active devices in an IC it makes any of the light emissions emitted outside of the IC significantly less detectable, and very likely undetectable to a PICA system 102.

Figure 11:
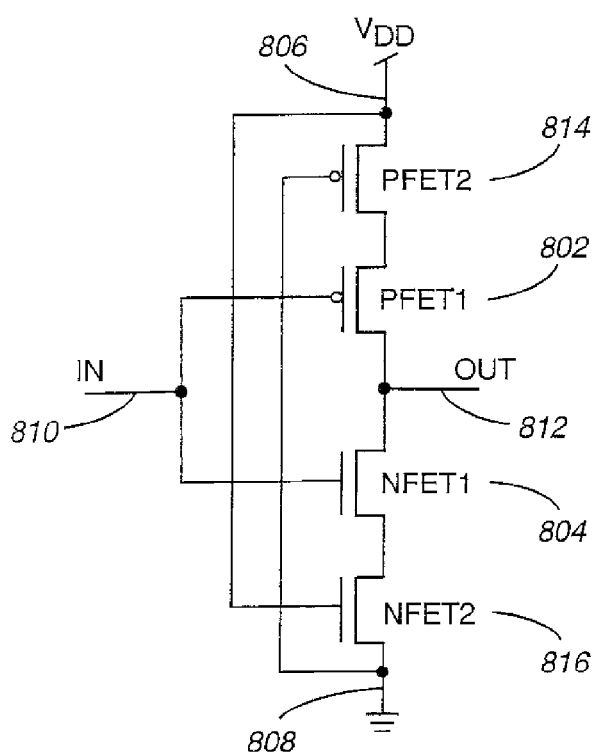
FIG. 11 is an electrical schematic diagram illustrating a second alternative inverter logic circuit example according to a preferred embodiment of the present invention.

FIG. 11 illustrates an alternative preferred embodiment for significantly reducing intensity of light emissions of active devices, such as FETs 802 and 804. This embodiment is an improvement over the one shown in FIG. 10 in that the input capacitive load is reduced, which may improve the overall performance of the IC. IC performance is a typical objective for selecting a circuit configuration. In this configuration, FETs 814 and 816 are prevented from operating in the saturation state, and devices 804 and 816 and devices 802 and 814 share their respective output to supply voltage distributions. The intensity of light emissions from FETs 802 and 804 is significantly reduced and preferably completely prevented. This will substantially protect the IC from external detection and monitoring of light emissions from the circuit devices. Techniques such as these, comprised of reducing or eliminating light emissions through the use of circuit configurations that modify the operational characteristics of the switching transistors during switching transitions, and refinement of the configurations to improve IC performance may be applied to a variety of MOS logic implementations.

Figure 12:
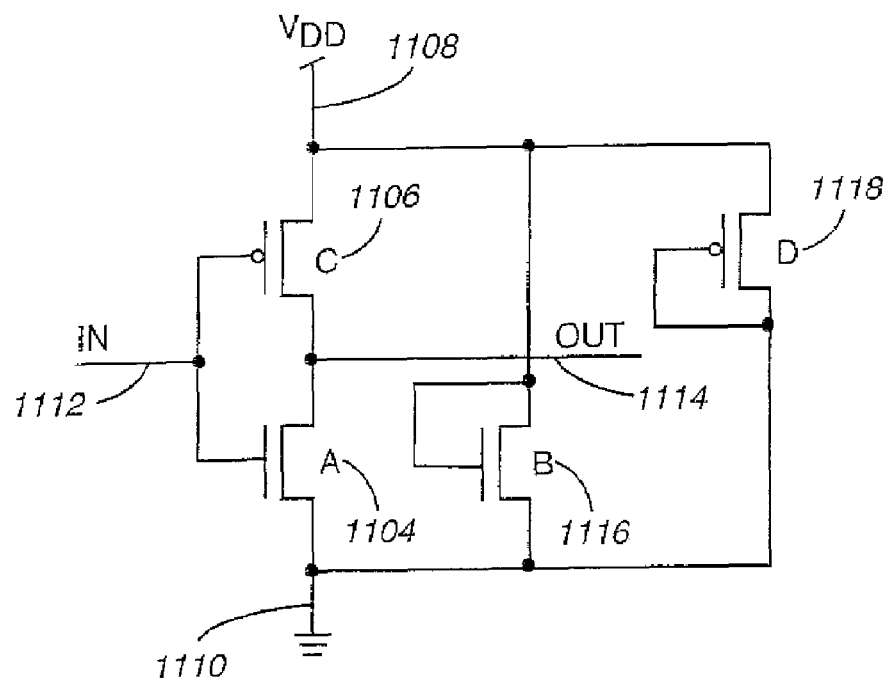
FIG. 12 is an electrical schematic diagram illustrating a third alternative inverter logic circuit example according to a preferred embodiment of the present invention.
Figure 13:
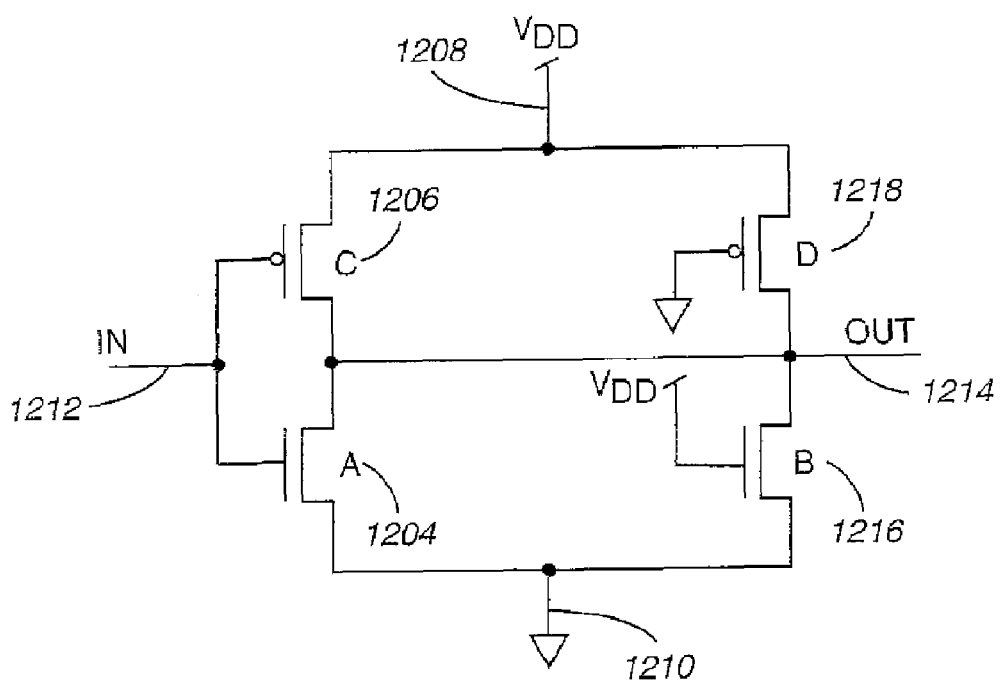
FIG. 13 is an electrical schematic diagram illustrating a fourth alternative inverter logic circuit example according to a preferred embodiment of the present invention.
Figure 14:
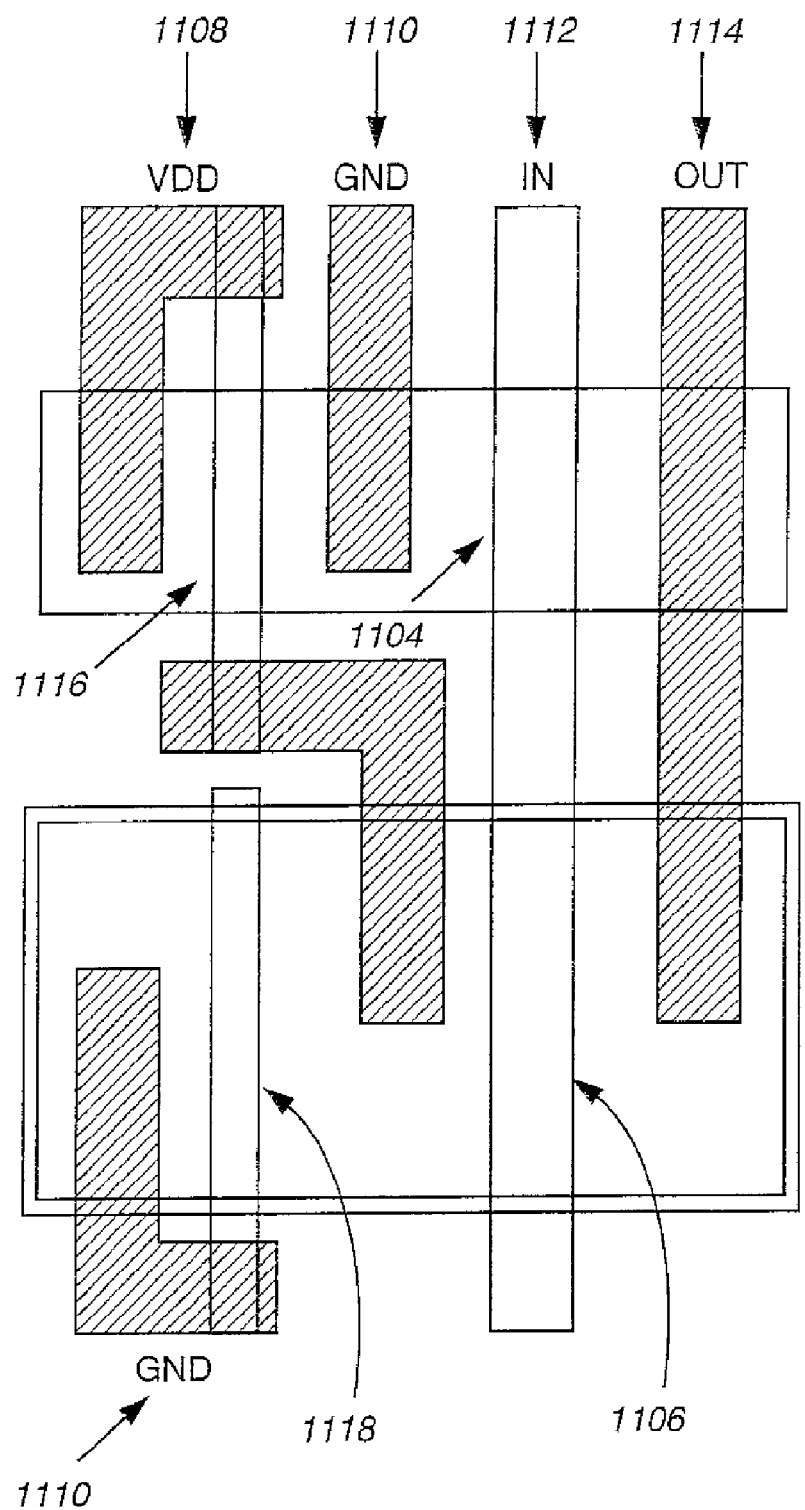
FIG. 14 is a circuit layout diagram illustrating an exemplary circuit layout for the inverter logic circuit example of FIG. 12.
Figure 15:
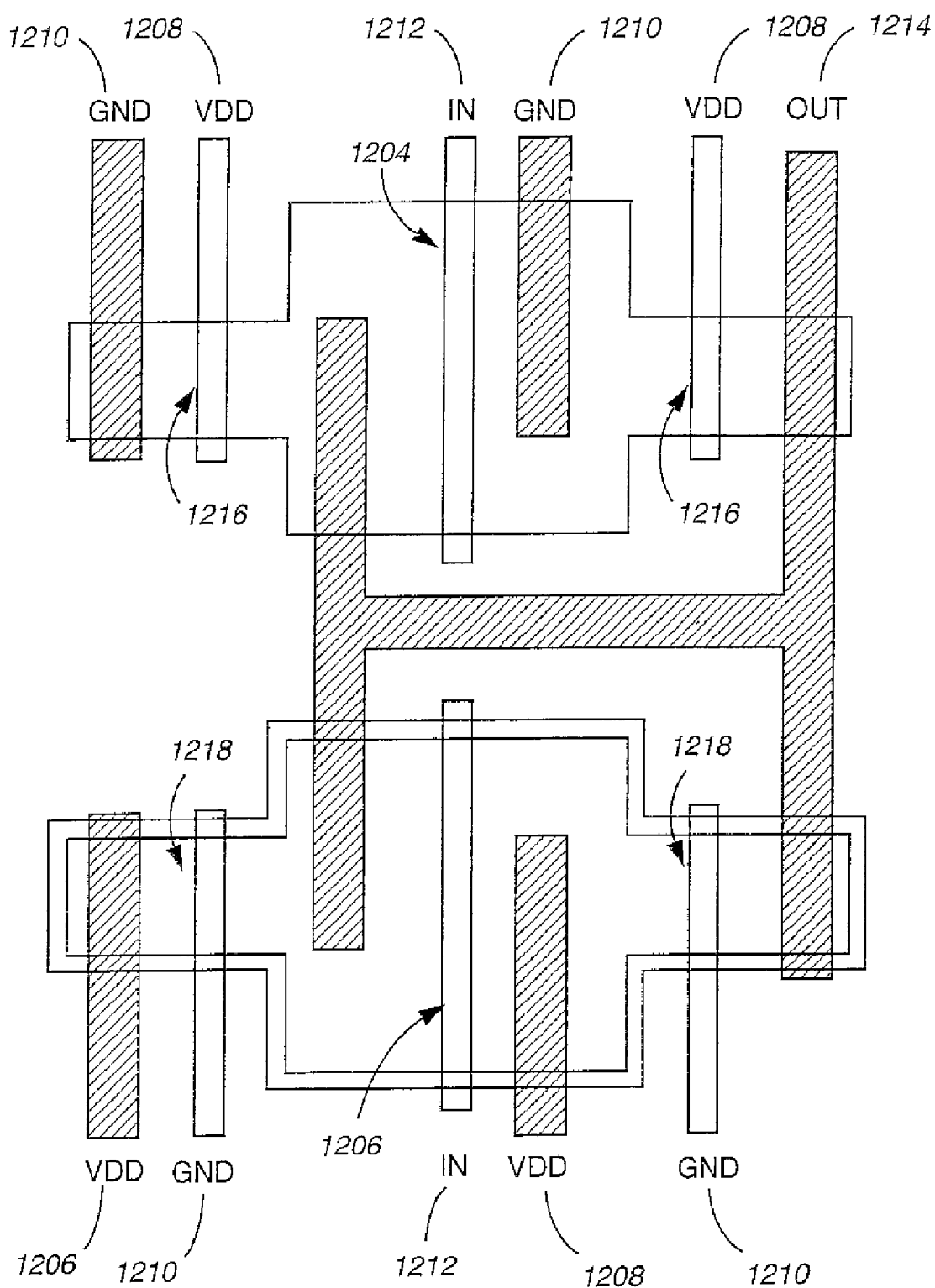
FIG. 15 is a circuit layout diagram illustrating an exemplary circuit layout for the inverter logic circuit example of FIG. 13.

Referring to FIGS. 12, 13, 14, and 15, another exemplary means of preventing external detection and monitoring of light emissions from active devices in an IC is shown, according to an alternative preferred embodiment of the present invention. FIGS. 14 and 15 show examples of circuit layout corresponding to the schematics of FIGS. 12 and 13, respectively. FIGS. 12 and 13, illustrate the use of a significantly brighter source of light emissions in close proximity to the circuit elements of interest. This arrangement of bright light emissions in close proximity to the actual light emissions from the active devices of interest prevents external detection by the PICA system 102 by fading the actual light emissions relative to the extraneous brighter light emissions. FIGS. 12 and 13 illustrate two different configurations 1102, 1202, across power (VDD) 1108, 1208, and ground 1110, 1210, references, respectively, for an inverter logic circuit. In FIG. 13, as a first example, the inverter logic circuit 1102 comprises two FETs A 1104 and C 1106 that switch and invert logic signals from an input 1112 to an output 1114. The brighter light emission source comprises a saturation biased FET B 1116 that is in close proximity to FET A 1104 and optionally a saturation biased FET D 1118 that is in close proximity to FET C 1106. Refer to FIG. 15 for an example of an IC circuit layout that locates the FET B 1116 (generating brighter light emissions) in close proximity to FET A 1104. Any light emissions from the switching FET A 1104 will be significantly faded and covered up by the brighter light emissions from the FET B 1116.

In another example, an inverter logic circuit 1202, as shown in FIG. 15, is in close proximity to a pair of brighter light emission sources, e.g., FET B 1216 and FET D 1218. Specifically, switching FET A 1204 and FET C 1206, respectively, are closely located to the brighter light emission sources to substantially fade and cover up any light emissions from the switching FETs 1204, 1206. See FIG. 15 for an exemplary circuit layout in an IC to locate in close proximity the brighter light emission sources, e.g., FET B 1216 and FET D 1218, to the switching active devices, e.g., FET A 1204 and FET C 1206, respectively. In this way, any light emissions from the switching active devices of interest, e.g., FET A 1204 and FET C 1206 will be substantially faded and covered up by the brighter light emissions of FET B 1216 and FET D 1218. The dimensions of integrated circuit devices and structures are now well below the diffraction limit for the spatial resolution of structures using light wavelengths where silicon substrates are transparent. Analogous placement of diffusions for gates showing complementary behavior where the spacing of the gates is below the resolution limit of the probing light in a laser voltage probe system can similarly defeat the use of the laser voltage probe system for reverse engineering.

Figure 16:
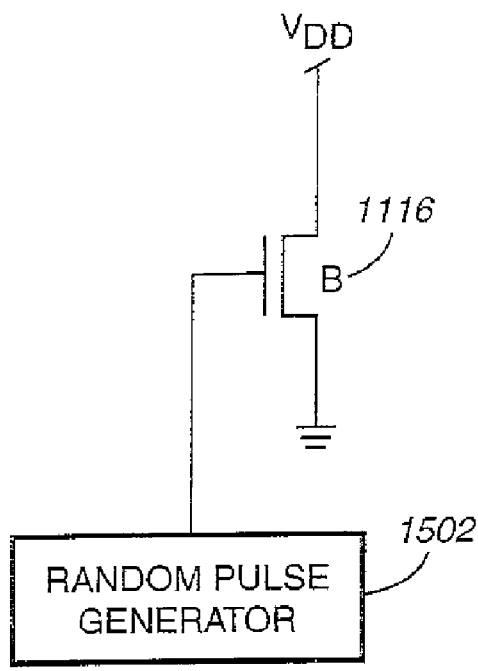
FIG. 16 is an electrical schematic diagram illustrating a fifth alternative inverter logic circuit example according to a preferred embodiment of the present invention.

As an alternative embodiment, with reference to FIG. 16, a light emission source, such as FET B 1116 shown in FIG. 16, may be driven by a random pulse generator 1502. In this way, the randomized light emissions from the FET B 1116 interfere with any detection of light emission patterns from a switched active device of interest, such as FET A 1104. Randomizing light emissions essentially destroys any pattern being detected by an external monitoring PICA system 102. In this way, the detection of light emissions will not yield any predictable circuit design thereby preventing reverse engineering analysis of an IC by detecting and monitoring light emissions therefrom.

Figure 17:
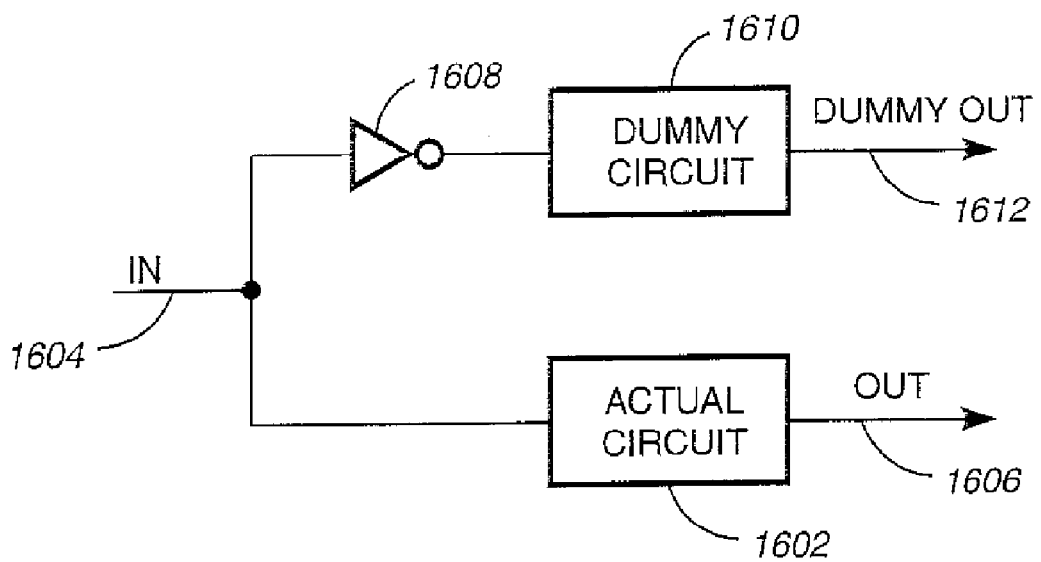
FIG. 17 is an electrical schematic diagram illustrating an alternative general circuit implementation according to a preferred embodiment of the present invention.

FIG. 17 illustrates another alternative embodiment of the present invention. Here an inverter 1608 drives a dummy circuit 1610 in close proximity to an actual circuit 1602. The dummy circuit 1610 generates confusing light emissions that are contemporaneous with light emissions from the actual circuit 1602. The dummy circuit 1610, for example, may emit a similar pattern of light emissions but the inverted logic, due to inverter 1608, causes a pattern of light emissions that are all at a similar intensity thereby preventing an external detector of a PICA system 102 from detecting and determining the polarity of transitions for switched active devices in the actual circuit 1602 in the IC. By preventing detection of the polarity of transitions of active devices in an IC, as discussed above, a PICA system 102 is not able to detect a predetermined pattern of transitions of active devices inside an IC. Accordingly, this prevents reverse engineering of the actual circuit 1602 by detection and monitoring of light emissions external to the IC. It can be shown that adoption of this step would produce only a factor of two slowing in the operation of the integrated circuit.

Thus, as has been discussed above, a circuit supporting substrate comprises an electrical circuit including at least one active device that, during electrical operation, operates to emit light from the at least one active device. The at least one active device may generate and emit light, as discussed above, as part of its electrical operation. Alternatively, the at least one active device may emit light that results from reflection of incident light on the at least one active device. While the at least one device operates, it may modulate and emit the light into light patterns that can be monitored external to the circuit supporting substrate to indicate varying electrical states of the at least one active device. Therefore, emitting light from the at least one active device, as used herein, includes both 1) the light that may be generated by the at least one active device and then emitted therefrom, and 2) the light that may be reflected by the at least one active device and emitted therefrom. To defeat reverse engineering by monitoring emissions of the light, in accordance with preferred embodiments of the present invention as have been discussed above, the circuit supporting substrate also includes means for preventing detection of a pattern of the emitted light external to the circuit supporting substrate. As may be readily appreciated by those having ordinary skill in the art, the means for preventing detection, as has been taught herein with reference to the various embodiments, provides significant advantages to users of the circuit supporting circuit over any known prior art devices. This is particularly valuable in applications where the security of the contents of an integrated circuit device and protection from its reverse engineering is important. For example, a SmartCard or other secure electronic device that contains at least one IC with confidential information may need its electronic memory protected from unauthorized reverse engineering.

Although specific embodiments of the invention have been disclosed, it will be understood by those having skill in the art that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A method of hiding a pattern of light emission emitted from at least one active device in an integrated circuit, the method comprising:

emitting extraneous light emission from an integrated circuit, the extraneous light emission being emitted in substantial close proximity to at least one active device in the integrated circuit thereby hiding a pattern of light emission emitted from the at least one active device, and wherein the emitting extraneous light emission comprises emitting randomized light emissions thereby hiding a pattern of light emission emitted from the at least one active device.

2. The method of claim 1, wherein the randomized light emissions being emitted in substantial close proximity to the at least one active device in the integrated circuit by a separate at least one active device in the integrated circuit.

3. The method of claim 1, wherein the randomized light emissions being emitted in substantial close proximity to the at least one active device in the integrated circuit by at least one of:

randomized light emissions from a separate at least one active device in the integrated circuit, and randomized light emissions from randomly delaying an electrical signal that is electrically coupled to the at least one active device and, in response to the randomly delayed electrical signal, the at least one active device randomly emitting light emissions, thereby hiding a pattern of light emission emitted from the at least one active device.

4. The method of claim 3, wherein the pattern of light emission emitted from the at least one active device comprises a time-based pattern of light emission that is separate from the randomized light emissions in substantial close proximity to the at least one active device.

5. A method of hiding a pattern of light emission emitted from at least one active device in an integrated circuit, the method comprising:

hiding a pattern of emitted light from at least one active device disposed on a circuit supporting substrate by emitting randomized light emissions in substantial close proximity to the at least one active device.

6. The method of claim 5, wherein the hiding of a pattern of emitted light is performed by at least one source of randomized light emissions disposed on the circuit supporting substrate and in substantial close proximity to the at least one active device.

7. The method of claim 5, wherein the hiding of a pattern of emitted light is performed by at least one dummy circuit disposed on the circuit supporting substrate in substantial close proximity to an actual circuit also disposed on the circuit supporting substrate and comprising the at least one active device, the dummy circuit emitting randomized light emissions that hide a pattern of the emitted light from the at least one active device.

8. The method of claim 5, wherein the pattern of the emitted light from the at least one active device comprises a time-based pattern of emitted light that is separate from the randomized light emissions in substantial close proximity to the at least one active device.

9. A method of hiding a pattern of light emission emitted from at least one active device in an electronic device, the method comprising:

hiding a pattern of emitted light from at least one active device in an electrical circuit by emitting randomized light emissions in substantial close proximity to the at least one active device.

10. The method of claim 9, wherein the hiding of a pattern of emitted light is performed by at least one source of randomized light emissions in the electronic device and in substantial close proximity to the at least one active device.

11. The method of claim 9, wherein the hiding of a pattern of emitted light is performed by at least one dummy circuit in substantial close proximity to an actual circuit comprising the at least one active device, the dummy circuit emitting randomized light emissions that hide a pattern of the emitted light from the at least one active device.

12. The method of claim 9, wherein the pattern of the emitted light from the at least one active device comprises a time-based pattern of emitted light that is separate from the randomized light emissions in substantial close proximity to the at least one active device.

* * * * *